(12) United States Patent
Nakano et al.

(10) Patent No.: US 10,741,423 B2
(45) Date of Patent: Aug. 11, 2020

(54) SUBSTRATE CLEANING APPARATUS, SUBSTRATE PROCESSING APPARATUS, AND METHOD OF CLEANING SUBSTRATE

(71) Applicant: Ebara Corporation, Tokyo (JP)

(72) Inventors: Hisajiro Nakano, Tokyo (JP); Junji Kunisawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 263 days.

(21) Appl. No.: 15/978,320

(22) Filed: May 14, 2018

(65) Prior Publication Data
US 2018/0337072 A1 Nov. 22, 2018

(30) Foreign Application Priority Data

May 16, 2017 (JP) .................. 2017-097621

(51) Int. Cl.
*H01L 21/67* (2006.01)
*H01L 21/687* (2006.01)
*H01L 21/677* (2006.01)

(52) U.S. Cl.
CPC .. *H01L 21/67046* (2013.01); *H01L 21/67034* (2013.01); *H01L 21/67051* (2013.01); *H01L 21/67219* (2013.01); *H01L 21/67742* (2013.01); *H01L 21/68728* (2013.01); *H01L 21/68785* (2013.01)

(58) Field of Classification Search
CPC ......... H01L 21/67046; H01L 21/67051; H01L 21/67034; H01L 21/67742; H01L 21/68728; H01L 21/67219; H01L 21/68785
See application file for complete search history.

(56) References Cited

U.S. PATENT DOCUMENTS

| | | | |
|---|---|---|---|
| 2006/0277702 A1* | 12/2006 | Lin | B08B 1/04 15/77 |
| 2007/0226992 A1 | 10/2007 | Kaneko et al. | |
| 2008/0011325 A1* | 1/2008 | Olgado | B08B 1/04 134/9 |
| 2011/0168214 A1* | 7/2011 | Kaneko | B24B 37/345 134/157 |
| 2016/0243592 A1* | 8/2016 | Tanaka | B08B 13/00 |

FOREIGN PATENT DOCUMENTS

| | | |
|---|---|---|
| JP | 10-289889 A | 10/1998 |
| JP | 4937807 B2 | 5/2012 |

* cited by examiner

*Primary Examiner* — Benjamin L Osterhout
(74) *Attorney, Agent, or Firm* — Leydig, Voit & Mayer, Ltd.

(57) ABSTRACT

A substrate cleaning apparatus and related apparatuses/ methods are disclosed. In one embodiment, a substrate cleaning apparatus includes: a first spindle group including a first driving spindle having a first driving roller configured to rotate a substrate and an idler spindle having a driven roller rotated by the substrate; a second spindle group including a plurality of second driving spindles each having a second driving roller configured to rotate the substrate; a cleaning mechanism configured to clean the substrate rotated by the first driving roller and the plurality of second driving rollers; and a rotation detector configured to detect the rotational speed of the driven roller. The driven roller is positioned on the opposite side to a direction in which the substrate receives a force from the cleaning mechanism.

7 Claims, 11 Drawing Sheets

SUBSTRATE CLEANING APPARATUS, SUBSTRATE PROCESSING APPARATUS, AND METHOD OF CLEANING SUBSTRATE

BACKGROUND OF THE INVENTION

Field of the Invention

The present invention relates to a substrate cleaning apparatus, a substrate processing apparatus, and a method of cleaning a substrate.

The present application claims priority based on Japanese Patent Application No. 2017-097621 filed on May 16, 2017 in Japan, the contents of which are incorporated herein by reference.

Description of Related Art

Conventionally, a substrate cleaning apparatus used in a substrate processing apparatus as disclosed in the following Japanese Patent No. 4937807 is known. The substrate cleaning apparatus includes a substrate holding and rotating mechanism configured to rotate a substrate (for example, a circular semiconductor substrate or a semiconductor wafer) while holding the substrate between a first spindle group and a second spindle group, and a cleaning mechanism configured to clean the substrate. Each of the first spindle group and the second spindle group has two driving spindles configured to rotate the substrate. While the substrate is held and rotated by these four driving spindles, the substrate is cleaned by the cleaning mechanism.

In addition, in this type of substrate cleaning apparatus, in order to stabilize the quality of a cleaned substrate, that is, in order to prevent generation of concerns such as attachment of a particle on the cleaned substrate including not only the center of the substrate but also a peripheral portion thereof, it is required to accurately measure the rotational speed of the substrate. As a method of measuring the rotational speed of a substrate, Japanese Unexamined Patent Application, First Publication No. 10-289889 discloses a method of bringing a driven roller into contact with an outer periphery of a substrate and integrally rotating the driven roller and a slit plate to detect the rotation state of the slit plate.

By the way, miniaturization of a semiconductor substrate has progressed in recent years. Therefore, it has been required to remove even minute deposits that were not a problem in the past from the substrate as much as possible. Therefore, in order to eliminate concerns such as attachment of a particle after cleaning the substrate, a higher level of management of a substrate cleaning process at the time of cleaning is also required.

For example, in a constitution in which the rotational speed of a substrate is indirectly detected by detecting the rotational speed of a driven roller as in the substrate cleaning apparatus disclosed in the above Japanese Unexamined Patent Application, First Publication No. 10-289889, it has been found that slip occurring between the driven roller and the substrate reduces the detection accuracy of the rotational speed of the substrate although this has not been a problem usually. Reduction in detection accuracy of the rotational speed of the substrate due to slip can be one of reasons causing non-uniform cleaning performance. Therefore, in order to suppress occurrence of such slip, for example, it is effective to increase a pressing force of the driven roller against the substrate.

Meanwhile, for example, in the substrate cleaning apparatus disclosed in Japanese Patent No. 4937807, as described above, a holding and rotating unit 52 of each spindle 50 is brought into contact with a peripheral portion of a substrate W to hold the substrate W (refer to FIG. 9 of Japanese Patent No. 4937807). In the case of the four driving rollers as disclosed in Japanese Patent No. 4937807, when a holding force with which the holding and rotating unit holds the substrate W is not uniform, rotation of the substrate W held by the holding and rotating unit is not stabilized, and processing efficiency of cleaning of the substrate W or the like may be lowered. In addition, in a case where a driven roller for measuring the rotational speed of the substrate is brought into contact with the substrate with a strong pressing force, a balance of forces applied to the substrate is lost, and deformation of the substrate or the like may occur. Furthermore, if the number of rollers in contact with the substrate is increased, dirt attached to the rollers due to cleaning is attached again to the substrate, and the substrate may be contaminated easily.

For the above reasons, in a circumstance in which the cleaning level required for a semiconductor substrate has been further increased in recent years, in order to meet such a requirement, in a case of continuously cleaning a plurality of substrates with a substrate cleaning apparatus, it has become difficult to accurately measure the rotational speed of a substrate in a substrate holding and rotating mechanism while stabilizing the quality of cleaning of the substrate used for the substrate cleaning apparatus.

SUMMARY OF THE INVENTION

The present invention has been achieved in view of such circumstances and provides a substrate cleaning apparatus, a substrate processing apparatus, and a method of cleaning a substrate capable of accurately measuring the rotational speed of a substrate using a driven roller while stabilizing the quality of cleaning of the substrate.

A first aspect of the present invention is a substrate cleaning apparatus including: a first spindle group including a first driving spindle having a first driving roller configured to rotate a substrate and an idler spindle having a driven roller rotated by the substrate; a second spindle group including a plurality of second driving spindles each having a second driving roller configured to rotate the substrate; a cleaning mechanism configured to clean the substrate rotated by the first driving roller and the plurality of second driving rollers; and a rotation detector configured to detect the rotational speed of the driven roller, in which the driven roller is positioned on the opposite side to a direction in which the substrate receives a force from the cleaning mechanism.

In the substrate cleaning apparatus according to the above aspect, the driven roller is positioned on the opposite side to a direction in which the substrate receives a force from the cleaning mechanism. This makes it possible to effectively utilize a pressing force of the cleaning mechanism as a force for pressing the substrate against the driving roller, for example, as compared with a case where the driven roller is positioned in a direction in which the substrate receives a force from the cleaning mechanism. Therefore, even if one driving roller in the constitution of Japanese Patent No. 4937807 is replaced with a driven roller, each driving roller can reliably rotate the substrate.

In addition, the number of rollers in contact with the substrate is reduced, and occurrence of contamination of the substrate by dirt attached to these rollers can be suppressed, for example, as compared with a case where a driven roller is added to the constitution of Japanese Patent No. 4937807.

Furthermore, even if the pressing force of the driven roller against the substrate is equal to the pressing force of the driving roller against the substrate, a balance of the forces applied to the substrate is not deteriorated as compared with the constitution of Japanese Patent No. 4937807. Therefore, it is possible to suppress slip occurring between the driven roller and the substrate by pressing the driven roller against the substrate with a strong force while suppressing deformation of the substrate or the like.

As described above, according to the substrate cleaning apparatus according to the above aspect, the rotation detector detects the rotational speed of the driven roller and can thereby stabilize the quality of cleaning of the substrate while accurately measuring the rotational speed of the substrate.

A second aspect of the present invention is the substrate cleaning apparatus according to the first aspect, in which a moment of inertia when the driven roller is rotated may be smaller than a moment of inertia when the first driving roller is rotated.

In this case, by reducing the moment of inertia of the driven roller, the driven roller is easily rotated together with the substrate. That is, it is possible to suppress slip occurring between the driven roller and the substrate. Therefore, detection accuracy of the rotational speed of the substrate by the rotation detector can be improved.

A third aspect of the present invention is the substrate cleaning apparatus according to the first or second aspect, in which the substrate cleaning apparatus may include: a first moving mechanism configured to hold the first spindle group so as to be slidable and rotationally movable; and a second moving mechanism configured to hold the second spindle group so as to be slidable and not to be rotationally movable.

In this case, when the substrate is held between the first spindle group and the second spindle group, the first spindle group rotationally moves, and a balance of holding forces of the substrate by the spindles can be thereby uniform.

A fourth aspect of the present invention is the substrate cleaning apparatus according to any one of the first to third aspects, in which a substrate holding and rotating mechanism including the first spindle group and the second spindle group may be a mechanism in which the substrate is held vertically.

A fifth aspect of the present invention is the substrate cleaning apparatus according to any one of the first to fourth aspects including a dog connected to the idler spindle and a sensor to generate an ON/OFF signal output in response to a movement of the dog.

A sixth aspect of the present invention is a substrate processing apparatus including: the substrate cleaning apparatus according to any one of the first to fifth aspects; and a polishing section for polishing the substrate.

According to the substrate processing apparatus according to the above aspect, when a substrate polished by the polishing section is cleaned, it is possible to suppress, for example, attachment of dirt of a roller to the substrate again and to stabilize the quality of the processed substrate while accurately measuring the rotational speed of the substrate.

A seventh aspect of the present invention is a method configured to clean a substrate with the substrate cleaning apparatus according to any one of the first to fifth aspects, including: holding the substrate on a substrate holding and rotating mechanism including the first spindle group and the second spindle group; rotating the substrate; cleaning the substrate with a cleaning member while injecting a cleaning liquid to the substrate; stopping injection of the cleaning liquid; and separating the cleaning member from the substrate to stop rotation of the substrate.

According to the above aspects of the present invention, it is possible to provide a substrate cleaning apparatus, a substrate processing apparatus, and a method of cleaning a substrate capable of accurately measuring the rotational speed of a substrate using a driven roller while stabilizing the quality of cleaning of the substrate.

DETAILED DESCRIPTION OF THE INVENTION

Figure 1:
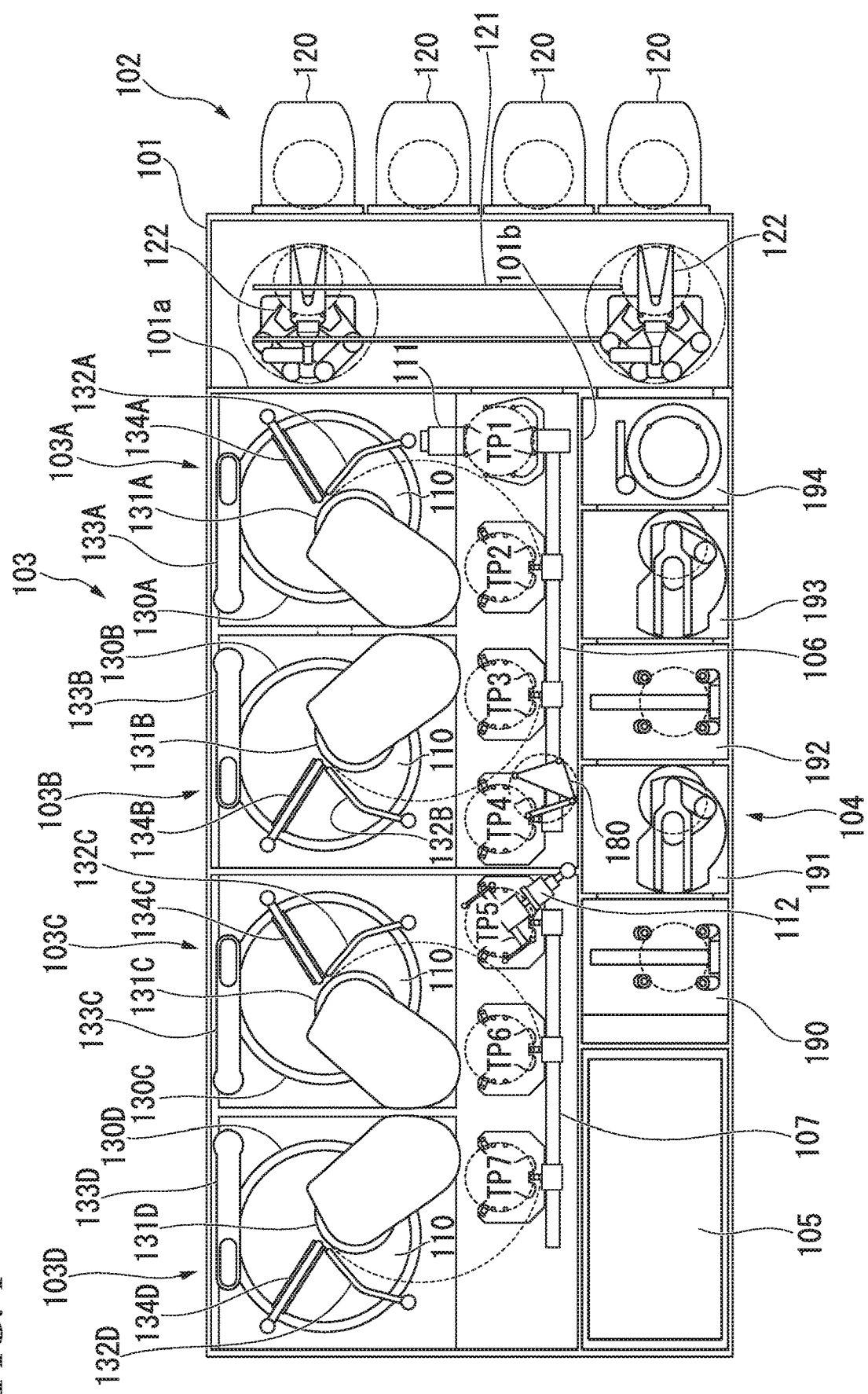
FIG. 1 is a schematic plan view showing the constitution of a substrate processing apparatus according to the present embodiment.

Hereinafter, the constitutions of a substrate cleaning apparatus and a substrate processing apparatus according to the present embodiment will be described in detail with reference to FIGS. 1 to 9. Incidentally, in the drawings used in the following description, the scale is appropriately changed in order to make each part have a recognizable size. In addition, in order to facilitate understanding of the constitution of each part, illustration of each part may be partially omitted.

Substrate Processing Apparatus

First, an embodiment of the substrate processing apparatus will be described. FIG. 1 is a plan view showing the overall constitution of the substrate processing apparatus according to the present embodiment. As shown in FIG. 1, the substrate processing apparatus includes a substantially rectangular housing 101, and the inside of the housing 101 is partitioned into a load/unload section 102, a polishing section 103, and a cleaning section 104 by partition walls 101a and 101b. The load/unload section 102, the polishing section 103, and the cleaning section 104 are independently assembled and independently evacuated. In addition, the substrate processing apparatus includes a control section 105 for controlling a substrate processing operation.

The load/unload section 102 includes two or more (four in the present embodiment) front load units 120 on which a wafer cassette for storing a large number of substrates (wafers) is placed. The front load units 120 are disposed adjacent to the housing 101 and are arranged in a width direction (direction perpendicular to a longitudinal direction) of the substrate processing apparatus. An open cassette, a standard manufacturing interface (SMIF) pod, or a front opening unified pod (FOUP) can be mounted on each of the front load units 120. Here, each of the SMIF and FOUP is an airtight container capable of maintaining an environment independent of an external space by housing a wafer cassette therein and being covered with a partition wall.

In addition, a traveling mechanism 121 is disposed along the row of the front load units 120 in the load/unload section 102, and two transport robots (loaders) 122 movable in an arrangement direction of the wafer cassette are disposed on the traveling mechanism 121. The transport robots 122 can access the wafer cassette mounted on each of the front load units 120 by moving on the traveling mechanism 121. Each of the transport robots 122 has two hands at the top and the bottom, uses the upper hand when returning a processed substrate to the wafer cassette, and uses the lower hand when taking out an unprocessed substrate from the wafer cassette. Each of the transport robots 122 can use the upper and lower hands properly. Furthermore, the lower hand of the transport robot 122 is rotated around an axis thereof to be able to place the substrate upside down.

The load/unload section 102 is a region where it is necessary to keep the cleanest state. Therefore, the inside of the load/unload section 102 is maintained all the times at a higher pressure than each of the outside of the substrate processing apparatus, the polishing section 103, and the cleaning section 104. The polishing section 103 is the dirtiest region because of using a slurry as a polishing liquid. Therefore, a negative pressure is formed inside the polishing section 103, and the pressure thereof is maintained to be lower than the internal pressure of the cleaning section 104. A filter fan unit (not shown) including a clean air filter such as a HEPA filter, an ULPA filter, or a chemical filter is disposed in the load/unload section 102, and clean air from which a particle, a toxic vapor, and a poisonous gas have been removed blows out all the times from the filter fan unit.

The polishing section 103 is a region where a substrate is polished (planarization and chemical mechanical polishing) and includes a first polishing unit 103A, a second polishing unit 103B, a third polishing unit 103C, and a fourth polishing unit 103D. As shown in FIG. 1, the first polishing unit 103A, the second polishing unit 103B, the third polishing unit 103C, and the fourth polishing unit 103D are arranged in a longitudinal direction of the substrate processing apparatus.

As shown in FIG. 1, the first polishing unit 103A includes: a polishing table 130A to which a polishing pad 110 having a polishing surface is attached; a top ring 131A configured to hold a substrate and polishing the substrate while pressing the substrate against the polishing pad 110 on the polishing table 130A; a polishing liquid supply nozzle 132A for supplying a polishing liquid or a dressing liquid (for example, pure water) to the polishing pad 110; a dresser 133A for dressing the polishing surface of the polishing pad 110; and an atomizer 134A for injecting a mixed fluid of a liquid (for example, pure water) and a gas (for example, a nitrogen gas) or a liquid (for example, pure water) in a form of mist to the polishing surface.

Similarly, the second polishing unit 103B includes a polishing table 130B to which the polishing pad 110 is attached, a top ring 131B, a polishing liquid supply nozzle 132B, a dresser 133B, and an atomizer 134B. The third polishing unit 103C includes a polishing table 130C to which the polishing pad 110 is attached, a top ring 131C, a polishing liquid supply nozzle 132C, a dresser 133C, and an atomizer 134C. The fourth polishing unit 103D includes a polishing table 130D to which the polishing pad 110 is attached, a top ring 131D, a polishing liquid supply nozzle 132D, a dresser 133D, and an atomizer 134D.

The first polishing unit 103A, the second polishing unit 103B, the third polishing unit 103C, and the fourth polishing unit 103D have the same constitution as one another. Therefore, hereinafter, the first polishing unit 103A will be described as a representative.

Next, a transport mechanism for transporting a substrate will be described. As shown in FIG. 1, a first linear transporter 106 is disposed adjacent to the first polishing unit 103A and the second polishing unit 103B. The first linear transporter 106 is a mechanism for transporting a substrate among four transport positions in a direction in which the polishing units 103A and 103B are arranged (referred to as a first transport position TP1, a second transport position TP2, a third transport position TP3, and a fourth transport position TP4 in order from the side of the load/unload section).

In addition, a second linear transporter 107 is disposed adjacent to the third polishing unit 103C and the fourth polishing unit 103D. The second linear transporter 107 is a mechanism for transporting a substrate among three transport positions in a direction in which the polishing units 103C and 103D are arranged (referred to as a fifth transport position TP5, a sixth transport position TP6, and a seventh transport position TP7 in order from the side of the load/unload section).

The substrate is transported to the polishing units 103A and 103B by the first linear transporter 106. As described above, the top ring 131A of the first polishing unit 103A moves between a polishing position and the second transport position TP2 by a swing motion of a top ring head (not shown). Therefore, transfer of the substrate to the top ring 131A is performed at the second transport position TP2. Similarly, the top ring 131B of the second polishing unit 103B moves between a polishing position and the third transport position TP3, and transfer of the substrate to the top ring 131B is performed at the third transport position TP3. The top ring 131C of the third polishing unit 103C moves between a polishing position and the sixth transport position TP6, and transfer of the substrate to the top ring 131C is performed at the sixth transport position TP6. The top ring 131D of the fourth polishing unit 103D moves between a polishing position and the seventh transport position TP7, and transfer of the substrate to the top ring 131D is performed at the seventh transport position TP7.

A lifter 111 for receiving the substrate from the transport robot 122 is disposed at the first transport position TP1. The substrate is transferred from the transport robot 122 to the first linear transporter 106 via the lifter 111. A shutter (not shown) is disposed between the lifter 111 and the transport robot 122 on the partition wall 101*a*. When the substrate is transported, the shutter is opened, and the substrate is transferred from the transport robot 122 to the lifter 111. A swing transporter (not shown) is disposed among the first linear transporter 106, the second linear transporter 107, and the cleaning section 104. This swing transporter has a hand that can move between the fourth transport position TP4 and the fifth transport position TP5 and transfers the substrate from the first linear transporter 106 to the second linear transporter 107. The substrate is transported to the third polishing unit 103C and/or the fourth polishing unit 103D by the second linear transporter 107. The substrate polished by the polishing section 103 is transported to the cleaning section 104 via the swing transporter.

Figure 2A:
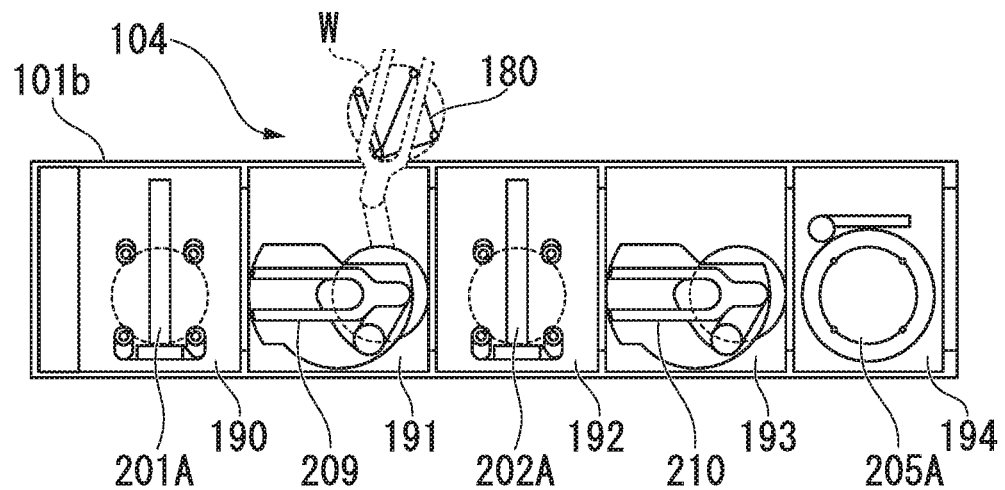
FIG. 2A is a plan view showing a cleaning section.
Figure 2B:
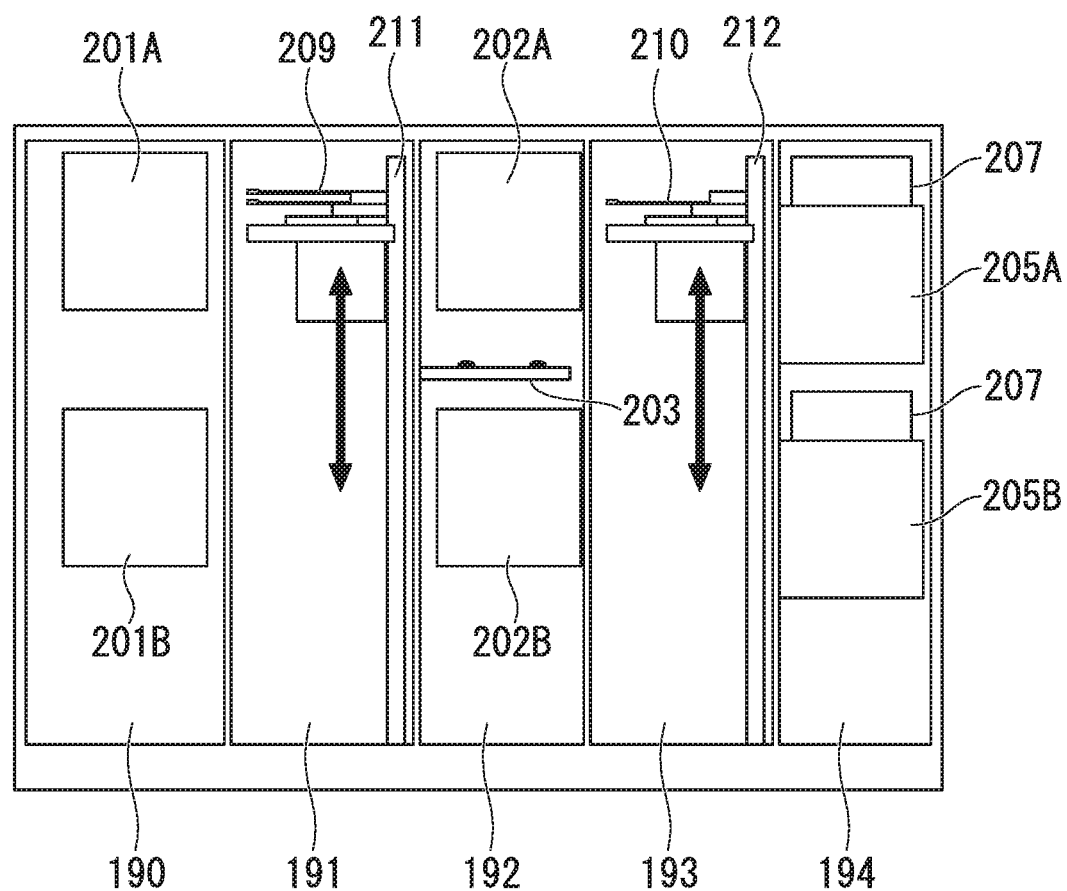
FIG. 2B is a side view showing the cleaning section.

FIG. 2A is a plan view showing the cleaning section 104, and FIG. 2B is a side view showing the cleaning section 104. As shown in FIGS. 2A and 2B, the cleaning section 104 is partitioned into a first cleaning chamber 190, a first transport chamber 191, a second cleaning chamber 192, a second transport chamber 193, and a drying chamber 194. In the first cleaning chamber 190, an upper primary substrate cleaning apparatus 201A and a lower primary substrate cleaning apparatus 201B arranged in a longitudinal direction are disposed. The upper primary substrate cleaning apparatus 201A is disposed above the lower primary substrate cleaning apparatus 201B. Similarly, in the second cleaning chamber 192, an upper secondary substrate cleaning apparatus 202A and a lower secondary substrate cleaning apparatus 202B arranged in a longitudinal direction are disposed. The upper secondary substrate cleaning device 202A is disposed above the lower secondary substrate cleaning device 202B. The substrate cleaning apparatuses 201A, 201B, 202A, and 202B are cleaning machines configured to clean a substrate using a cleaning liquid. The substrate cleaning apparatuses 201A, 201B, 202A, and 202B are arranged in the vertical direction, and therefore have an advantage that a footprint area is small.

A temporary placement stand 203 for a substrate is disposed between the upper secondary substrate cleaning apparatus 202A and the lower secondary substrate cleaning apparatus 202B. In the drying chamber 194, an upper drying module 205A and a lower drying module 205B arranged in a longitudinal direction are disposed. The upper drying module 205A and the lower drying module 205B are isolated from each other. Filter fan units 207 and 207 for supplying clean air into the drying modules 205A and 205B are disposed above the upper drying module 205A and the lower drying module 205B, respectively. The upper primary substrate cleaning apparatus 201A, the lower primary substrate cleaning apparatus 201B, the upper secondary substrate cleaning apparatus 202A, the lower secondary substrate cleaning apparatus 202B, the temporary placement stand 203, the upper drying module 205A, and the lower drying module 205B are fixed to a frame (not shown) via bolts and the like.

In the first transport chamber 191, a first transport robot 209 that can vertically move is disposed. In the second transport chamber 193, a second transport robot 210 that can vertically move is disposed. The first transport robot 209 and the second transport robot 210 are supported by support shafts 211 and 212 extending in a longitudinal direction so as to be movable, respectively. The first transport robot 209 and the second transport robot 210 each have a driving mechanism such as a motor therein and can vertically move along the support shafts 211 and 212, respectively. Like the transport robot 122, the first transport robot 209 has two-stage hands composed of upper and lower hands. As indicated by the dotted line in FIG. 2A, the first transport robot 209 is disposed at a position where the lower hand thereof can access a temporary placement stand 180. When the lower hand of the first transport robot 209 accesses the temporary placement stand 180, a shutter (not shown) disposed in the partition wall 101b opens.

The first transport robot 209 operates so as to transport the substrate W among the temporary placement stand 180, the upper primary substrate cleaning apparatus 201A, the lower primary substrate cleaning apparatus 201B, the temporary placement stand 203, the upper secondary substrate cleaning apparatus 202A, and the lower secondary substrate cleaning apparatus 202B. When a substrate before cleaning (substrate to which a slurry is attached) is transported, the first transport robot 209 uses the lower hand. When a substrate after cleaning is transported, the first transport robot 209 uses the upper hand. The second transport robot 210 operates so as to transport the substrate W among the upper secondary substrate cleaning apparatus 202A, the lower secondary substrate cleaning apparatus 202B, the temporary placement stand 203, the upper drying module 205A, and the lower drying module 205B. The second transport robot 210 transports only a cleaned substrate, and therefore has only one hand. The transport robot 122 shown in FIG. 1 takes out a substrate from the upper drying module 205A or the lower drying module 205B using the upper hand thereof and returns the substrate to a wafer cassette. When the upper hand of the transport robot 122 accesses the drying modules 205A and 205B, a shutter (not shown) disposed in the partition wall 101a opens.

The cleaning section 104 includes two primary substrate cleaning apparatuses and two secondary substrate cleaning apparatuses, and therefore can configure a plurality of cleaning lines configured to clean a plurality of substrates in parallel.

In the present embodiment, the primary substrate cleaning apparatuses 201A and 201B and the secondary substrate cleaning apparatuses 202A and 202B are roll sponge type cleaning machines. Incidentally, here, the roll sponge means an elongated sponge, and a rotation shaft (not shown) made of a hard material is disposed in a longitudinal direction.

The upper primary substrate cleaning apparatus 201A, the lower primary substrate cleaning apparatus 201B, the upper secondary substrate cleaning apparatus 202A, and the lower secondary substrate cleaning apparatus 202B may be the same type of substrate cleaning apparatuses or different types of substrate cleaning apparatuses. For example, the primary substrate cleaning apparatuses 201A and 201B may be roll type substrate cleaning apparatuses (refer to FIG. 7) for scrub cleaning upper and lower surfaces of a substrate with a pair of roll sponges, and the secondary substrate cleaning apparatuses 202A and 202B may be pencil type substrate cleaning apparatuses (refer to FIG. 8).

Substrate Cleaning Apparatus

Next, the detailed constitution of a roll type or pencil type substrate cleaning apparatus used as the substrate cleaning apparatuses 201A, 201B, 202A, and 202B will be described. These substrate cleaning apparatuses each include a substrate holding and rotating mechanism 1 shown in FIGS. 3 to 6 commonly. By disposing a roll type cleaning mechanism 2A (see FIG. 7) or a pencil type cleaning mechanism 2B (see FIG. 8) above the substrate holding and rotating mechanism 1, each of the substrate cleaning apparatuses 201A, 201B, 202A, 202B is configured.

Substrate Holding and Rotating Mechanism

Figure 3:
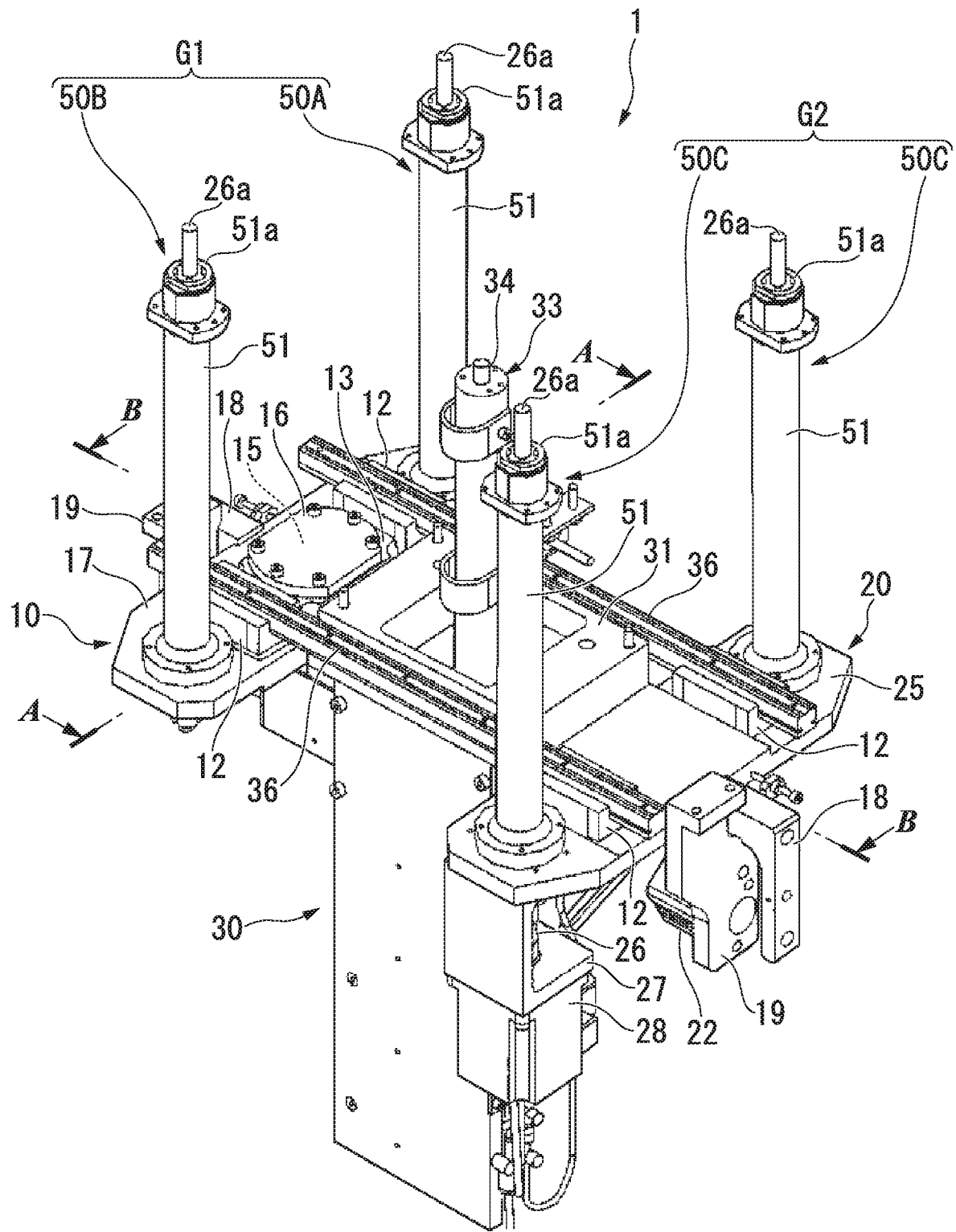
FIG. 3 is a perspective view showing a substrate holding and rotating mechanism included in a substrate cleaning apparatus in FIG. 1.

First, the substrate holding and rotating mechanism 1 will be described. As shown in FIG. 3, a cleaning member driving mechanism 30 for driving the cleaning mechanism 2A or the cleaning mechanism 2B is disposed in the central portion of the substrate holding and rotating mechanism 1. A first moving mechanism 10 and a second moving mechanism 20 are disposed on both sides sandwiching the cleaning member driving mechanism 30. The first moving mechanism 10 moves a first spindle group G1, and the second moving mechanism 20 moves a second spindle group G2. The first spindle group G1 includes a first driving spindle 50A and an idler spindle 50B, and the second spindle group G2 includes a plurality of second driving spindles 50C.

Figure 7:
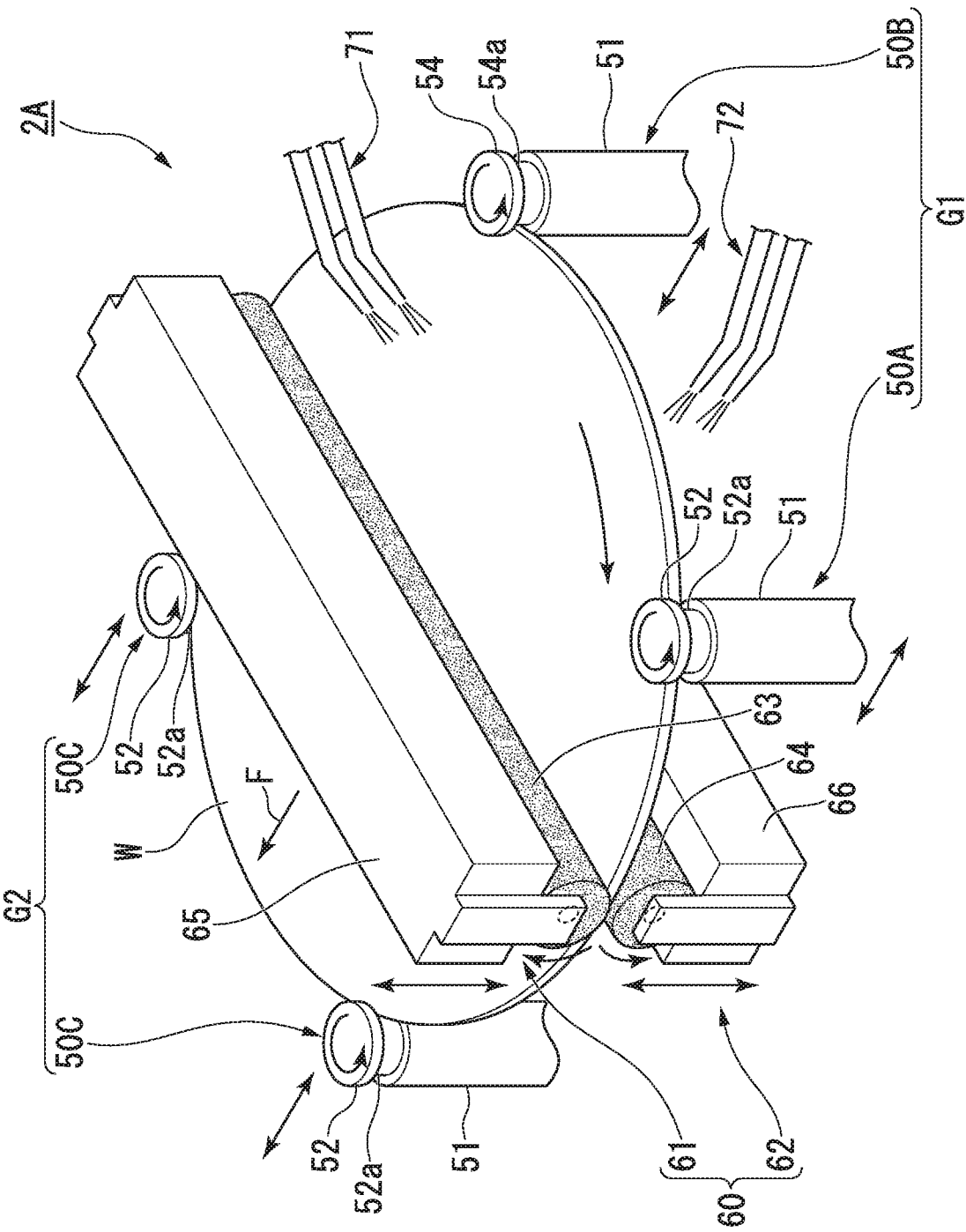
FIG. 7 is a perspective view showing a roll type cleaning mechanism.
Figure 8:
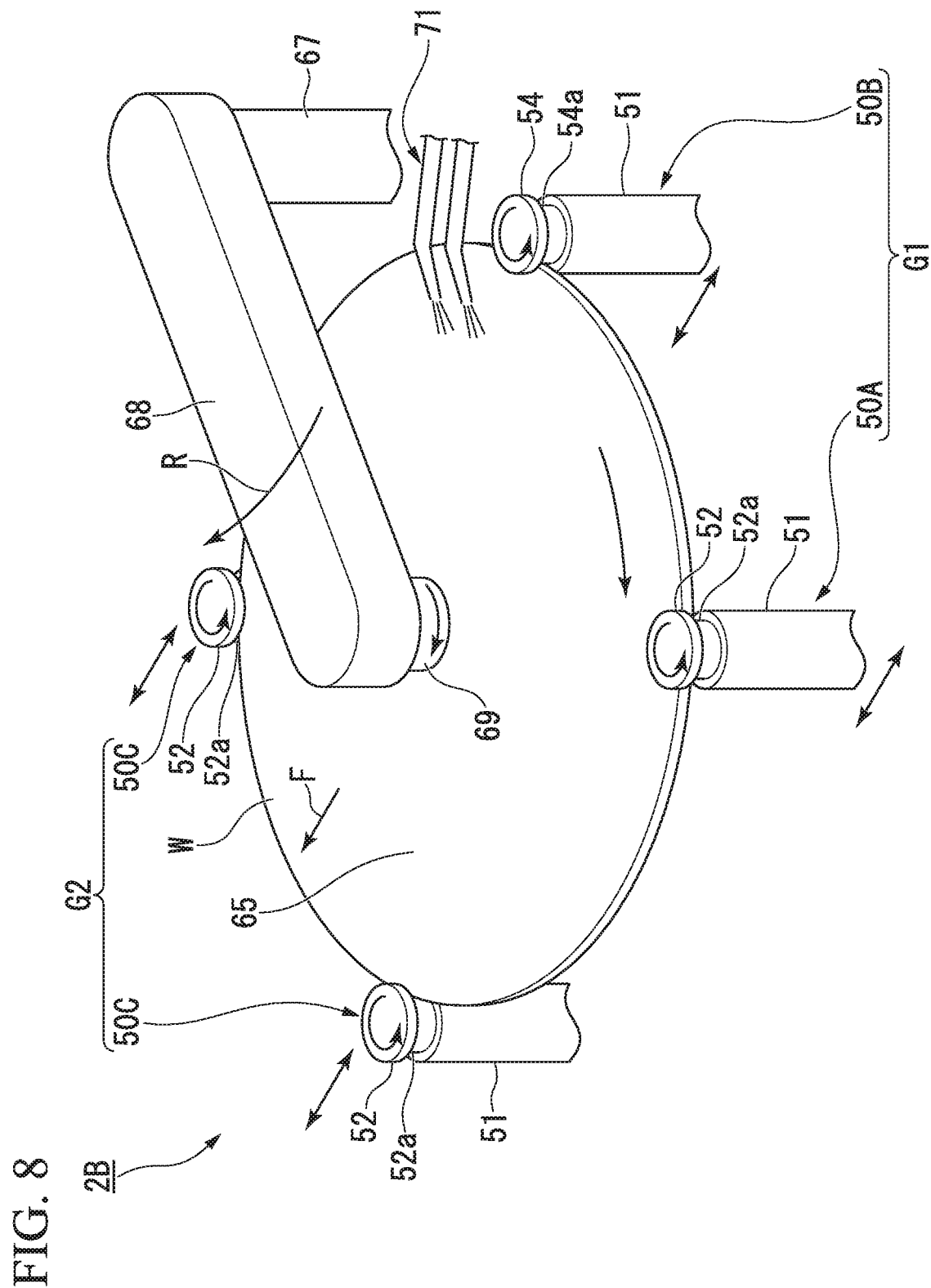
FIG. 8 is a perspective view showing a pencil type cleaning mechanism.

As shown in FIGS. 7 and 8, the first driving spindle 50A includes a driving roller 52 (first driving roller), the idler spindle 50B includes a driven roller 54, and each of the second driving spindles 50C includes a driving roller 52 (second driving roller).

The substrate holding and rotating mechanism 1 rotates the substrate W by a rotational force of the driving roller 52 while holding the substrate W by holding grooves 52a and 54a for the driving rollers 52 and the driven roller 54.

Figure 4:
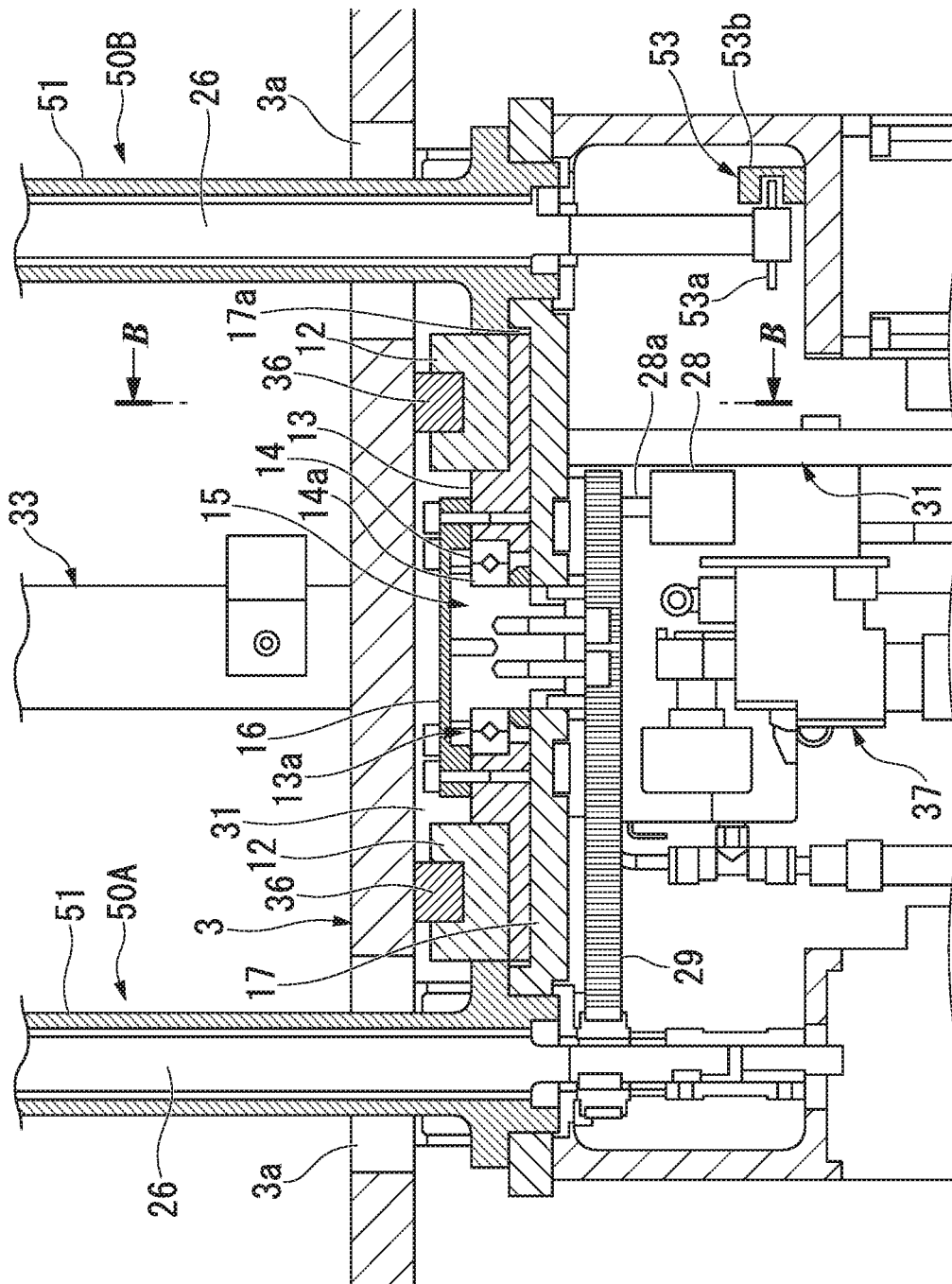
FIG. 4 is a cross-sectional view taken along line A-A of the substrate holding and rotating mechanism of FIG. 3.

The cleaning member driving mechanism 30 includes a cylinder 32 (not shown in FIG. 4) disposed inside a case 31 shown in FIG. 4 and a rod-shaped support member 33 driven by the cylinder 32. The support member 33 protrudes upward from the cylinder 32 and can vertically move by driving of the cylinder 32.

As shown in FIG. 3, an attachment portion 34 to which a cleaning mechanism described below is attached is disposed at an upper end of the support member 33. Meanwhile, a pair of linear slide rails 36 arranged in parallel to each other with the case 31 sandwiched therebetween is disposed on both sides of the case 31. To both ends of the pair of slide rails 36, the first moving mechanism 10 and the second moving mechanism 20 are attached so as to be slidable.

First Moving Mechanism

Here, the constitution of the first moving mechanism 10 will be described. As shown in FIGS. 3 and 4, a slider 12 having a substantially U-shaped cross section is engaged with each of the slide rails 36. The slider 12 slides with respect to each of the slide rails 36 in a direction in which the slide rails 36 extend. A connecting member 13 formed in a substantially rectangular flat plate shape is attached to a lower surface of each of the sliders 12. An opening 13a vertically penetrating the connecting member 13 is disposed in the central portion of the connecting member 13, and a bearing 14 is fitted to an inner periphery of the opening 13a. A substantially columnar shaft member 15 is attached to an inner ring 14a of the bearing 14. The shaft member 15 is rotatably held in the opening 13a by the bearing 14 with respect to the connecting member 13. A cover 16 covering an upper surface of the shaft member 15 disposed in the opening 13a is attached to the top of the opening 13a.

Figure 6:
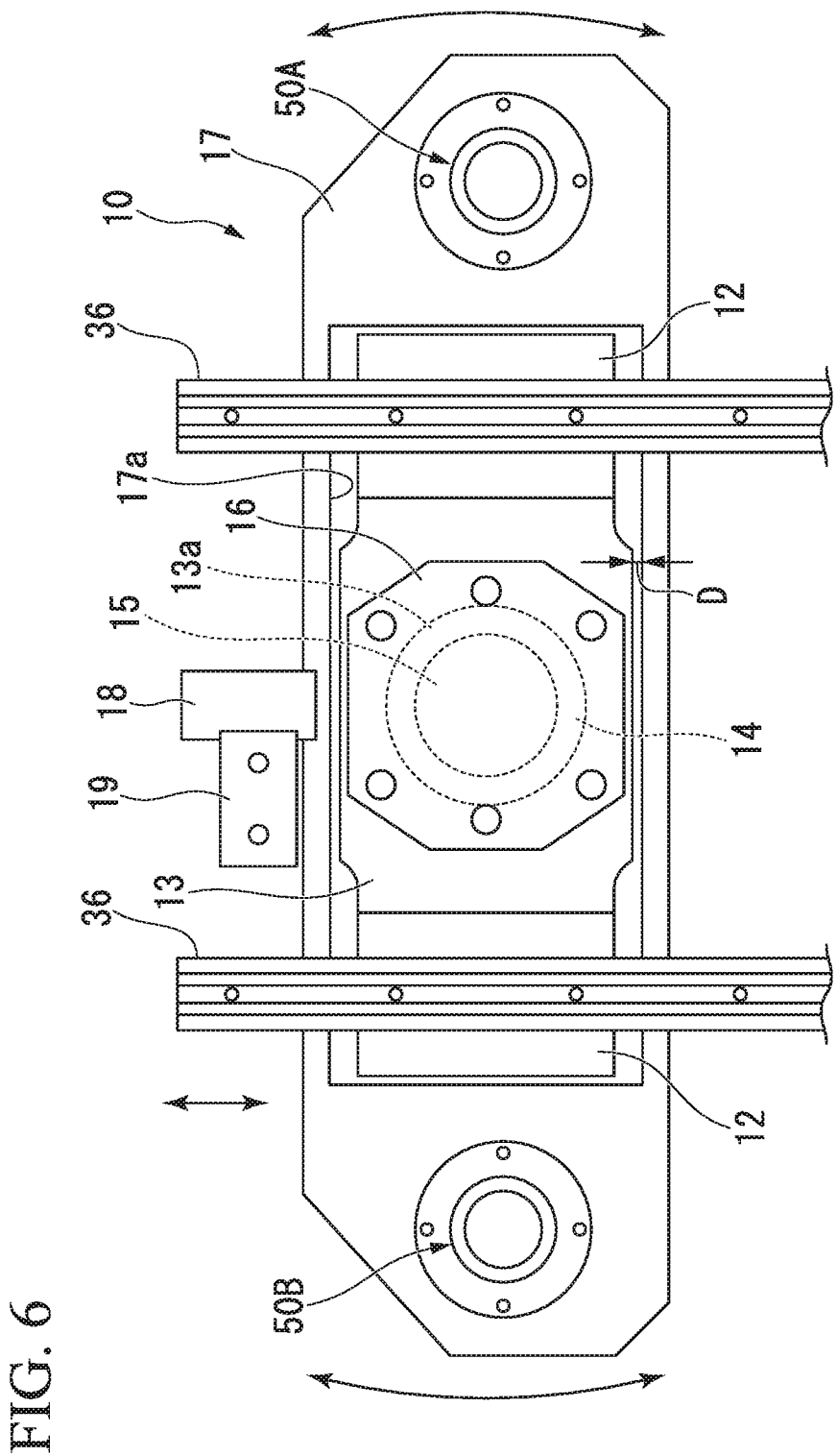
FIG. 6 is a plan view of a first moving mechanism in FIG. 3.

A base member 17 formed in a substantially rectangular flat plate shape is disposed on a lower surface side of the connecting member 13. The outer shape of the base member 17 is larger than that of the connecting member 13, and the central portion of the upper surface thereof is fixed to a lower end surface of the shaft member 15 via bolts. As a result, the base member 17 rotates integrally with the shaft member 15 around the shaft member 15 in a horizontal plane as shown in FIG. 6.

As shown in FIG. 4, a substantially rectangular recess 17a for housing a lower portion of the connecting member 13 is formed on an upper surface of the base member 17. A clearance D (refer to FIG. 6) of a small size is disposed between an inner peripheral surface of the recess 17a and an outer peripheral surface of the connecting member 13. Therefore, the base member 17 can rotate with respect to the connecting member 13 within a range where the connecting member 13 and the base member 17 are not in contact with each other with the clearance D. Note that the width of the clearance D is about 2 mm in the present embodiment.

Figure 5:
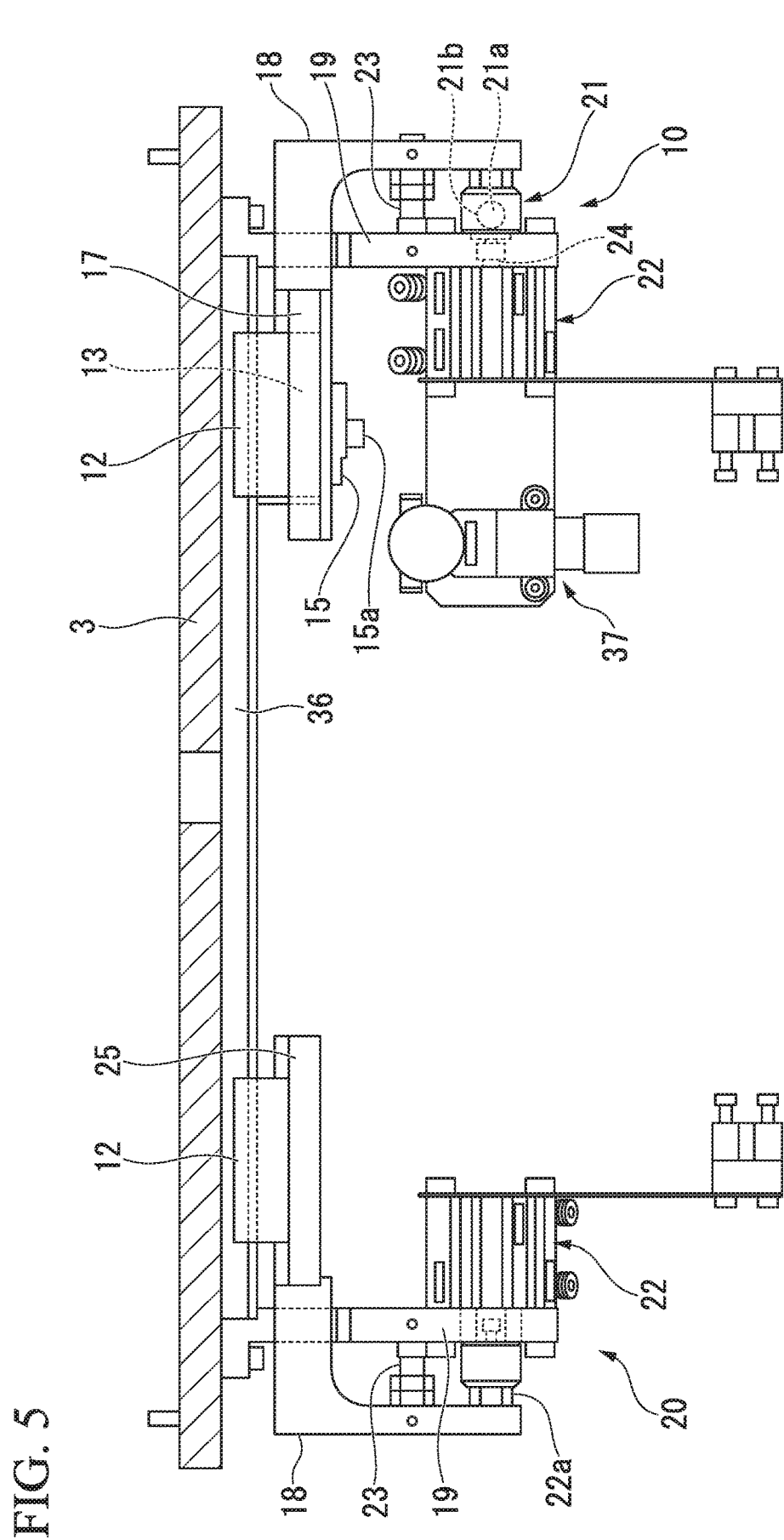
FIG. 5 is a cross-sectional view taken along line B-B of the substrate holding and rotating mechanism of FIG. 3.

As shown in FIG. 5, a guide member 18 having a substantially L shape and having one end thereof facing downward is attached outside the base member 17 (outside the base member 17 in an extending direction of the slide rails 36). A plate-shaped locking member 19 having an upper end fixed to a partition member 3 described below is disposed inside the guide member 18. A cylinder 22 is attached to the inside of the locking member 19, and a tip of a rod 24 driven to advance and retreat by the cylinder 22 is connected to the inside of the guide member 18 via a floating joint 21.

Although not shown in detail, the floating joint 21 is constituted by a pair of connectors attached to the rod 24 side and the guide member 18 side. A spherical projection 21a in one of the connectors is rotatably engaged with the inside of a spherical recess 21b in the other connector. As a result, the guide member 18 is connected to the rod 24 so as to be swingable (rotatable) in substantially all the directions. Therefore, the base member 17 and the connecting member 13 can be integrally reciprocated along the slide rails 36 by driving of the cylinder 22, and the base member 17 and the guide member 18 can freely rotate in a horizontal plane independently of the locking member 19 and the cylinder 22.

As shown in FIG. 5, a protruding stopper member 23 which has a tip in contact with an outer surface of the locking member 19 and regulates movement of the base member 17 and the connecting member 13 at a predetermined position is attached to an inner surface of the guide member 18. Note that reference numeral 37 represents a regulator attached to the cylinder 22. As described above, the first moving mechanism 10 includes a reciprocating mechanism for integrally reciprocating the base member 17 and the connecting member 13 in a linear direction along the slide rails 36 and a rotating mechanism for rotatably disposing the base member 17 with respect to the connecting member 13 around the shaft member 15 in a horizontal plane.

That is, the first moving mechanism 10 holds the first spindle group G1 so as to be slidable along the slide rails 36 and rotationally movable around the shaft member 15.

As shown in FIG. 4, each of the spindles 50A and 50B includes a cylindrical main body 51 and a shaft 26 inserted into the main body 51. Incidentally, although not shown, the constitution of the second driving spindle 50C is similar to that of the first driving spindle 50A.

As shown in FIG. 3, an attachment portion 51a for attaching the driving roller 52 or the driven roller 54 (refer to FIG. 7) is disposed at an upper end of the main body 51 in each of the spindles 50A and 50B. An upper end 26a of the shaft 26 protruding from the attachment portion 51a is connected to the driving roller 52 or the driven roller 54, and the shaft 26 and the driving roller 52 or the driven roller 54 thereby rotate integrally. Note that FIG. 3 shows a state in which the driving roller 52 and the driven roller 54 have been removed from the attachment portion 51a.

As shown in FIGS. 4 and 6, both sides of the base member 17 protrude to both outer sides of each of the slide rails 36 (both outer sides orthogonal to the extending direction of the slide rails 36), and the first driving spindle 50A and the idler spindle 50B stand upright on an upper surface of the protruding portion. As shown in FIG. 4, the shaft 26 rotatably disposed in the main body 51 of each of the spindles 50A and 50B penetrates the base member 17 and protrudes to a lower surface side thereof. A motor 28 is disposed below the base member 17, and a transmission belt 29 is stretched between a rotation shaft 28*a* of the motor 28 and the shaft 26 in the first driving spindle 50A. The motor 28 inputs a driving force to the shaft 26 of the first driving spindle 50A via the transmission belt 29 and rotates the shaft 26 and the driving roller 52 integrally.

As shown in FIG. 7, the holding grooves 52*a* and 54*a* in contact with an outer periphery of the substrate W are formed on outer peripheral surfaces of the driving roller 52 and the driven roller 54. By rotation of the driving rollers 52 in a state where a peripheral portion of the substrate W is held in the holding groove 52*a*, the substrate W is rotated. In addition, by rotation of the substrate W in a state where the substrate W is held in the holding groove 54*a* in the driven roller 54, the shaft 26 of the idler spindle 50B is driven to rotate together with the driven roller 54.

As shown in FIG. 4, a rotation detector 53 including a pair of dogs 53*a* and a sensor 53*b* configured to detect rotation of the dogs 53*a* is disposed at a lower end of the shaft 26 of the idler spindle 50B. The pair of dogs 53*a* extends from the center axis of the shaft 26 of the idler spindle 50B toward an outside thereof. As the sensor 53*b*, for example, an optical sensor including a light projecting portion and a light receiving portion can be used.

In the rotation detector 53, an output signal of the sensor 53*b* changes depending on whether the dogs 53*a* are positioned between the light projecting portion and the light receiving portion of the sensor 53*b*, and the rotational speed of the dogs 53*a*, that is, the rotational speed of the driven roller 54 can be detected, for example, from a time interval at which the output signal changes. The rotational speed of the substrate W is proportional to the rotational speed of the driven roller 54, and therefore the rotational speed of the substrate W can be calculated from the rotational speed of the driven roller 54.

As described above, the rotation detector 53 indirectly detects the rotational speed of the substrate W by detecting the rotational speed of the driven roller 54.

Second Moving Mechanism

The second moving mechanism 20 includes a single base member 25 corresponding to one obtained by integrally constituting the members 13 and 17 in place of the base member 17 and the connecting member 13 included in the first moving mechanism 10. In the second moving mechanism 20, although not shown, the shafts 26 of the two second driving spindles 50C rotate synchronously by a motor. The constitutions of the other parts of the second moving mechanism 20 are common to those of the first moving mechanism 10. Therefore, in the drawings and description of the second moving mechanism 20, the same reference numeral is given to components common to the first moving mechanism, and a detailed description thereof will be omitted.

As shown in FIG. 3, in the second moving mechanism 20, a lower surface of the slider 12 is directly attached to an upper surface of the base member 25 without disposing members corresponding to the connecting member 13 and the shaft member 15, and only a reciprocating mechanism for reciprocating the base member 25 in a linear direction along the slide rails 36 is included.

That is, the second moving mechanism 20 holds the second spindle group G2 so as to be slidable in a linear direction along the slide rails 36 and not to be rotationally movable.

Roll Type Cleaning Mechanism

Next, the roll type cleaning mechanism 2A attached to the top of the substrate holding and rotating mechanism 1 will be described. The cleaning mechanism 2A shown in FIG. 7 includes a roll cleaning member 60 configured to clean the substrate W, an upper nozzle 71 for supplying a cleaning liquid toward an upper surface of the substrate W, and a lower nozzle 72 for supplying a cleaning liquid toward a lower surface of the substrate W.

The roll cleaning member 60 includes an upper cleaning member 61 configured to clean an upper surface of the substrate W and a lower cleaning member 62 configured to clean a lower surface of the substrate W. The cleaning members 61 and 62 include columnar roll sponges 63 and 64 slidably in contact with an upper surface or a lower surface of the substrate W and roll sponge attachment members 65 and 66 to which the roll sponges 63 and 64 are rotatably attached, respectively. Examples of a material of the roll sponges 63 and 64 include a porous PVA sponge and foamed polyurethane. The cleaning members 61 and 62 are disposed such that longitudinal directions thereof extend between the spindle groups G1 and G2.

Each of the roll sponges 63 and 64 is formed into a length equal to or larger than the diameter of the substrate W so as to be slidably in contact with the entire upper and lower surfaces of the substrate W. In addition, the upper cleaning member 61 is attached to a driving mechanism (not shown) for vertically moving and rotating the roll sponge 63. Meanwhile, although not shown in detail, the lower cleaning member 62 is attached to the attachment portion 34 of the support member 33.

The upper nozzle 71 and the lower nozzle 72 are connected to a cleaning liquid supply source (not shown) and inject a cleaning liquid toward an upper surface or a lower surface of the substrate W. Examples of the cleaning liquid include ultrapure water, ammonia water, and hydrofluoric acid.

As shown in FIG. 7, the roll sponge 63 rotates in a direction of pushing the substrate W toward the second spindle group G2 at a contact portion with the substrate W. Similarly, the roll sponge 64 rotates in a direction of pushing the substrate W toward the second spindle group G2 at a contact portion with the substrate W. As a result, the substrate W receives a pushing force (refer to arrow F) toward the second spindle group G2 from the roll cleaning member 60. Hereinafter, a direction in which the substrate W receives a force from the cleaning mechanism 2A in this way will be simply referred to as a pressing direction F.

Pencil Type Cleaning Mechanism

Next, the pencil type cleaning mechanism 2B will be described. The cleaning mechanism 2B shown in FIG. 8 includes a rotation shaft 67, a swing arm 68, and a pencil type cleaning member 69. The swing arm 68 is rotated around the rotation shaft 67. The cleaning member 69 is attached to a lower surface of the swing arm 68 at a tip thereof. The pencil type cleaning member 69 in the present embodiment is formed in a cylindrical shape extending in the vertical direction. Examples of a material of the cleaning member 69 include foamed polyurethane and PVA.

When the swing arm 68 rotates around the rotation shaft 67, the pencil cleaning member 69 attached to the tip of the swing arm 68 moves on the substrate W in an arc-shaped locus. The tip of the swing arm 68 extends to the center of the substrate W. Therefore, the movement locus of the pencil cleaning member 69 passes through the center of the substrate W. The pencil cleaning member 69 is moved to an outer periphery of the substrate W. By movement of the pencil cleaning member 69 in the locus as described above while the substrate W rotates, the entire upper surface of the substrate W is cleaned by the pencil cleaning member 69.

Here, a swinging direction of the swing arm 68 while the pencil cleaning member 69 is in contact with the substrate W is directed from the first spindle group G1 toward the second spindle group G2 as indicated by an arrow R in FIG. 8. By swinging of the swing arm 68 in this way, the substrate W receives a pushing force (refer to arrow F) toward the second spindle group G2 from the pencil cleaning member 69. Note that the direction of the arrow F is the same direction as the direction of the pushing force by the roll cleaning member 60 shown in FIG. 7. That is, the pressing direction F in the pencil type cleaning mechanism 2B is similar to the pressing direction F in the roll type cleaning mechanism 2A.

The whole of the substrate cleaning apparatus configured as described above is housed in a box-shaped casing. As shown in FIGS. 4 and 5, upper surfaces of the slide rails 36 and an upper surface of the case 31 are fixed to a lower surface side of a plate-shaped partition member 3 disposed in the casing. The inside of the casing is partitioned into a lower space and an upper space by the partition member 3. The substrate holding and rotating mechanism 1 is housed in the lower space, and the cleaning mechanism 2A or 2B is housed in the upper space. The partition member 3 prevents a cleaning liquid and the like configured to clean a substrate with the cleaning mechanism 2A or 2B from reaching the substrate holding and rotating mechanism 1 in the lower space. Note that the spindles 50A to 50C and the support member 33 protrude upward from the partition member 3 through an opening 3a or the like formed in the partition member 3.

Next, an action of the substrate cleaning apparatus configured as described above will be described with reference to FIGS. 9A to 9D and FIG. 10.

FIGS. 9A to 9D are schematic views of the substrate cleaning apparatus as viewed from above. A straight line L shown in FIGS. 9A to 9D indicates a position where the pair of slide rails 36 extend. Hereinafter, the direction in which the slide rails 36 extend will be simply referred to as a slide direction L. FIG. 10 shows a flow of cleaning a substrate.

Figure 9A:
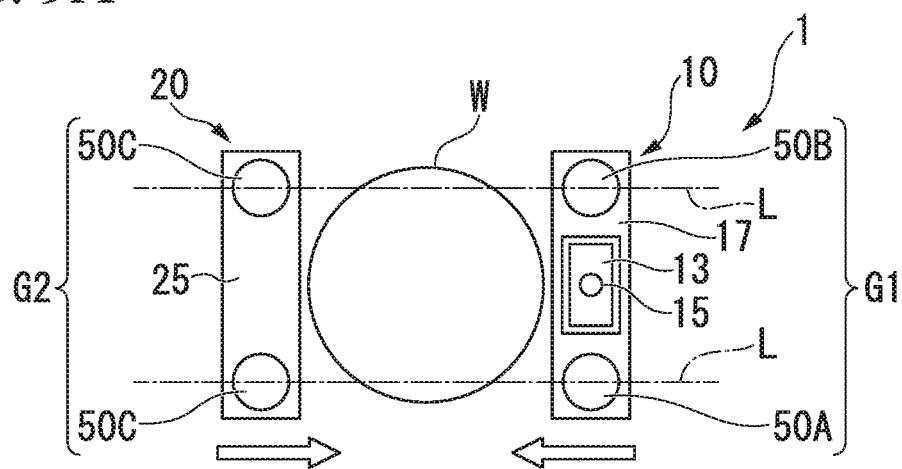
FIG. 9A is a schematic view showing an operation of the substrate cleaning apparatus.
Figure 10:
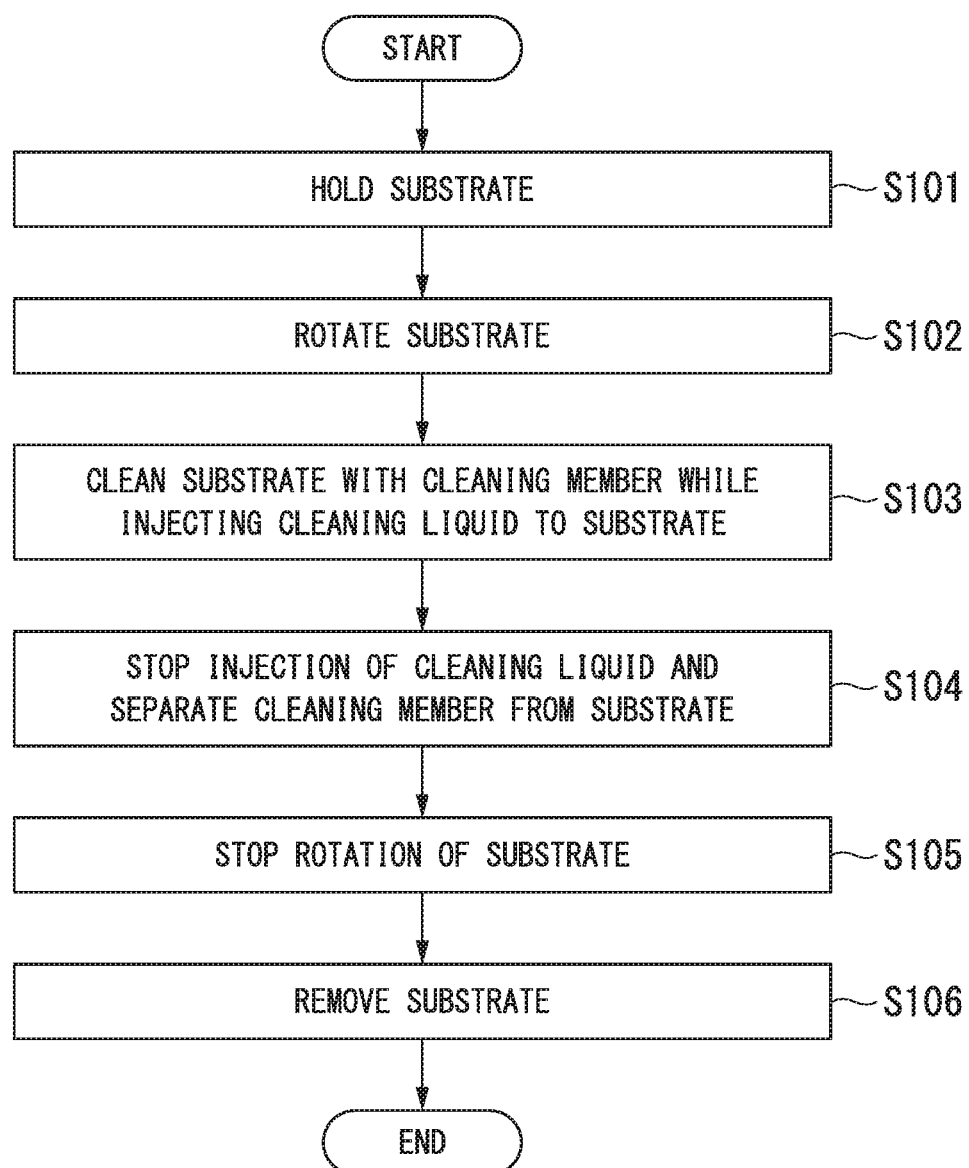
FIG. 10 is a flowchart showing a flow of cleaning a substrate.

When the substrate W is held, as shown in FIG. 9A, the first spindle group G1 and the second spindle group G2 disposed on both sides sandwiching the substrate W in the slide direction L are moved by the first moving mechanism 10 and the second moving mechanism 20 toward the substrate W. At this time, the second spindle group G2 comes into contact with the substrate W earlier than the first spindle group G1. Both the first spindle group G1 and the second spindle group G2 come into contact with a peripheral portion of the substrate W, and the substrate W is thereby held (S101 in FIG. 10).

Figure 9B:
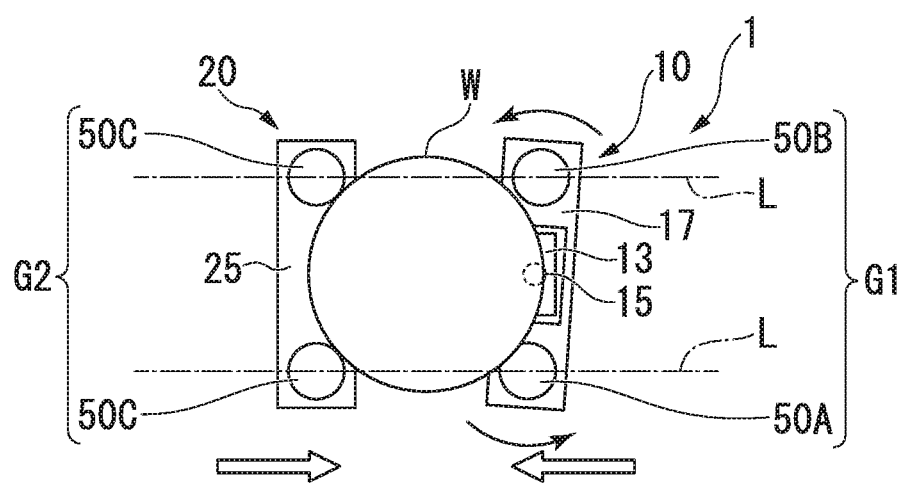
FIG. 9B is a schematic view showing an operation of the substrate cleaning apparatus.

By the way, when the substrate W is held in this way, it is also considered that the driving roller 52 of the first driving spindle 50A and the driven roller 54 of the idler spindle 50B are not in contact with the peripheral portion of the substrate W under a pressure equal to each other. However, in the present embodiment, as shown in FIG. 9B, one of the driving roller 52 and the driven roller 54 is into contact with the peripheral portion of the substrate W, the base member 17 thereby rotates around the shaft member 15, and the other comes into contact with the peripheral portion of the substrate W. By this operation, imbalance of a holding force configured to hold the substrate W by the driving roller 52 and the driven roller 54 is corrected, and the rollers are brought into contact with the peripheral portion of the substrate W under a pressure equal to each other.

Figure 9C:
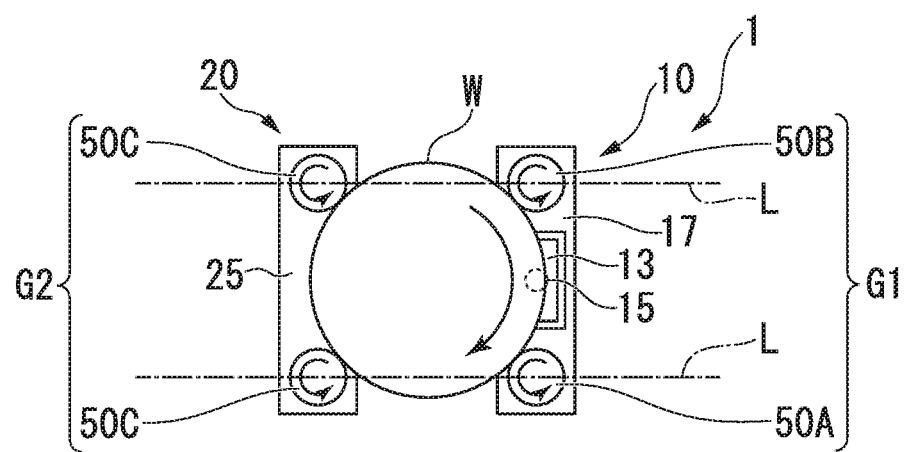
FIG. 9C is a schematic view showing an operation of the substrate cleaning apparatus.

Subsequently, the motor 28 is driven to rotate the driving roller 52 of each of the driving spindles 50A and 50C. As shown in FIG. 9C, the substrate W is rotated (S102 in FIG. 10). At this time, along with the rotation of the substrate W, the driven roller 54 is also driven to rotate. When the driven roller 54 rotates, the dogs 53a attached to the shaft 26 of the idler spindle 50B also rotate, and an ON/OFF signal output from the sensor 53b is switched at an interval corresponding to the rotational speed of the dogs 53a. Therefore, from the time interval at which the ON/OFF signal is switched, the rotational speed of the driven roller 54 can be detected. Furthermore, the driven roller 54 is driven by the rotation of the substrate W, and therefore the rotational speed of the substrate W can be indirectly calculated.

Figure 9D:
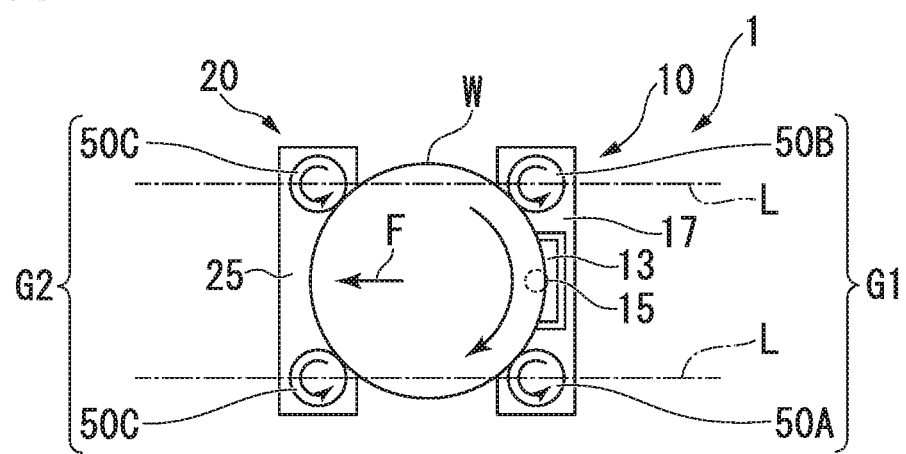
FIG. 9D is a schematic view showing an operation of the substrate cleaning apparatus.

When the substrate W starts to rotate, the roll cleaning member 60 or the pencil cleaning member 69 is pressed against the substrate W while the nozzles 71 and 72 inject a cleaning liquid toward the substrate W, and the substrate W is cleaned (S103 in FIG. 10). At this time, as shown in FIG. 9D, a pushing force in the pressing direction F toward the second spindle group G2, received from the roll cleaning member 60 or the pencil cleaning member 69, acts on the substrate W. Each of the plurality of driving rollers 52 included in the second spindle group G2 applies a rotational force to the substrate W. Therefore, the rotational force can be reliably applied to the substrate W, for example, as compared with a case where the idler spindle 50B is included in the second spindle group G2.

After completion of cleaning, the injection of the cleaning liquid is stopped, the roll cleaning member 60 or the pencil cleaning member 69 is separated from the substrate W (S104 in FIG. 10), and the rotation of the substrate W is stopped (S105 in FIG. 10). Thereafter, when a substrate gripping mechanism (for example, a hand mechanism) (not shown) receives the substrate W, the substrate W is removed from the first spindle group G1 and the second spindle group G2 (S106 in FIG. 10).

Furthermore, in the present embodiment, the driven roller 54 rotated by the substrate W is positioned on the opposite side to the pressing direction F. This makes it possible to effectively utilize a pressing force of the cleaning members 60 and 69 as a force for pressing the substrate W against the driving roller 52, for example, as compared with a case where the driven roller 54 is positioned in a direction in which the substrate W receives a force from the cleaning members 60 and 69. Therefore, the substrate W can be more reliably rotated by the driving roller 52.

In addition, the number of rollers in contact with the substrate W is reduced, and occurrence of contamination of the substrate W by dirt attached to these rollers can be suppressed, for example, as compared with a case where the driven roller 54 is added to the constitution of Japanese Patent No. 4937807.

Furthermore, even if the pressing force of the driven roller 54 against the substrate W is equal to the pressing force of the driving roller 52 against the substrate W, a balance of the forces applied to the substrate W is not deteriorated as compared with the constitution of Japanese Patent No. 4937807. Therefore, it is possible to suppress slip occurring between the driven roller 54 and the substrate W by pressing the driven roller 54 against the substrate W with a strong force while suppressing deformation of the substrate W or the like.

In addition, the first moving mechanism 10 holds the first spindle group G1 so as to be slidable and rotationally movable, and the second moving mechanism 20 holds the second spindle group G2 so as to be slidable and not to be rotationally movable. With this constitution, when the substrate W is held between the first spindle group G1 and the second spindle group G2, the first spindle group G1 rotationally moves, and a balance of holding forces of the substrate W by the spindles 50A to 50C can be thereby uniform.

Incidentally, in another embodiment, even after the motor 28 is driven to rotate the driving rollers 52 of the driving spindles 50A and 50C to rotate the substrate W, it may be detected whether the rollers are in contact with a peripheral portion of the substrate W with a pressing force equal to each other, for example, using a load cell (not shown) disposed in a spindle for supporting the rollers. Based on the detection result, a position adjustment mechanism (not shown) disposed on either the first moving mechanism 10 or the second moving mechanism 20 may correct a relative distance between the first spindle group G1 and the second spindle group G2, and subsequently cleaning may be performed. Alternatively, the relative distance between the first spindle group G1 and the second spindle group G2 may be corrected by considering the calculation result of the rotational speed of the substrate W and the pressing force detected using the load cell (not shown), and subsequently cleaning may be performed. As a result, it is possible to more reliably suppress slip occurring between the driven roller and the substrate by pressing the driven roller against the substrate with a relatively strong force while suppressing deformation of the substrate or the like, and to stabilize the quality of cleaning of the substrate while accurately measuring the rotational speed of the substrate.

As described above, according to the substrate cleaning apparatus of the present embodiment, the rotation detector 53 detects the rotational speed of the driven roller 54, and it is thereby possible to stabilize the quality of cleaning of the substrate W while accurately measuring the rotational speed of the substrate W.

Furthermore, according to a substrate processing apparatus 200 of the present embodiment, when the substrate W polished by the polishing section 103 is cleaned by the substrate cleaning apparatuses 201A, 201B, 202A, and 202B, it is possible to suppress, for example, attachment of dirt of the driving roller 52 or the driven roller 54 to the substrate W again and to stabilize the quality of the processed substrate W while accurately measuring the rotational speed of the substrate W.

Note that the technical scope of the present invention is not limited to the above embodiment, and various modifications can be made without departing from the gist of the present invention.

For example, in the above embodiment, each of the first spindle group G1 and the second spindle group G2 has two spindles, but the number of spindles included in each of the spindle groups G1 and G2 may be appropriately changed.

In addition, in the above embodiment, the rotational speed of the driven roller 54 is detected by the dogs 53a and the sensor 53b, but the rotational speed of the driven roller 54 may be detected by another type of rotation detector. For example, the rotational speed of the driven roller 54 may be detected by measuring the peripheral speed of the shaft 26 of the idler spindle 50B with a non-contact type speedometer or the like. In this case, the non-contact type speedometer corresponds to the rotation detector.

The moment of inertia when the driven roller 54 rotates may be smaller than the moment of inertia when the driving roller 52 rotates. In this case, along with the rotation of the substrate W, the driven roller 54 is more likely to rotate, and slip between the driven roller 54 and the substrate W hardly occurs. This makes it possible to detect the rotational speed of the substrate W more accurately.

Incidentally, as a method of reducing the moment of inertia when the driven roller 54 rotates, it is considered that the outer diameter of the shaft 26 in the idler spindle 50B is made smaller than the outer diameter of the shaft 26 in another spindle 50A or 50C. Alternatively, as a material of the shaft 26 of the idler spindle 50B, it is also considered to adopt a material having a lower density than the material of another shaft 26. According to these forms, it is possible to reduce the moment of inertia when the driven roller 54 rotates while the driving roller 52 and the driven roller 54 which are consumables are formed of the same kind of parts. In other words, by making parts of the driving roller 52 and the driven roller 54 common, cost can be reduced, and maintainability can be improved.

In the above embodiment, the substrate holding and rotating mechanism 1 in which the spindles 50A to 50C extend in the vertical direction and the substrate W is horizontally held has been described. However, a substrate holding and rotating mechanism in which the substrate W is vertically held, that is, a so-called upright type substrate holding and rotating mechanism may be adopted. In this case, it is possible to adopt such a form that the whole of the substrate holding and rotating mechanism 1 described in the above embodiment is tilted by 90°. In this case, when the substrate is pressed against the spindle, if the rotational speed is detected for a spindle positioned downward as viewed from the center of the substrate, an influence of a load of the substrate itself is also estimated. Therefore, it is also possible to detect the rotational speed for a spindle positioned upward as viewed from the center of the substrate.

The substrate processing apparatus 200 of the above embodiment includes both the roll type substrate cleaning apparatus and the pencil type substrate cleaning apparatus. However, the substrate processing apparatus 200 including either one of the substrate cleaning apparatuses may be adopted. The number and arrangement of the substrate cleaning apparatuses included in the substrate processing apparatus 200 can be appropriately changed. Alternatively, in place of the above polishing apparatus, another semiconductor processing apparatus such as a plating apparatus or a grinding apparatus may be used, and the substrate cleaning apparatus may be disposed at a subsequent stage of the semiconductor processing apparatus.

Besides, it is possible to appropriately replace the constituent elements in the above embodiment with well-known constituent elements, and the above embodiment and modification may be appropriately combined without departing from the gist of the present invention.

What is claimed is:
1. A substrate cleaning apparatus comprising:
a first spindle group comprising a first driving spindle having a first driving roller configured to rotate a substrate and an idler spindle having a driven roller rotated by the substrate;

a second spindle group comprising a plurality of second driving spindles each having a second driving roller configured to rotate the substrate;

a cleaning mechanism configured to clean the substrate rotated by the first driving roller and the plurality of second driving rollers; and a rotation detector configured to detect the rotational speed of the driven roller, wherein the driven roller is positioned on the opposite side to a direction in which the substrate receives a force from the cleaning mechanism.

2. The substrate cleaning apparatus according to claim 1, wherein a moment of inertia when the driven roller is rotated is smaller than a moment of inertia when the first driving roller is rotated.

3. The substrate cleaning apparatus according to claim 1, comprising:

a first moving mechanism configured to hold the first spindle group so as to be slidable and rotationally movable; and a second moving mechanism configured to hold the second spindle group so as to be slidable and not to be rotationally movable.

4. The substrate cleaning apparatus according to claim 1, wherein a substrate holding and rotating mechanism comprising the first spindle group and the second spindle group is a mechanism in which the substrate is held vertically.

5. The substrate cleaning apparatus according to claim 1, comprising:

a dog connected to the idler spindle; and a sensor to generate an ON/OFF signal output in response to a movement of the dog.

6. A substrate processing apparatus comprising:

the substrate cleaning apparatus according to claim 1; and a polishing section for polishing the substrate.

7. A method of cleaning a substrate with the substrate cleaning apparatus according to claim 1, comprising:

holding the substrate on a substrate holding and rotating mechanism comprising the first spindle group and the second spindle group;

rotating the substrate;

cleaning the substrate with a cleaning member while injecting a cleaning liquid to the substrate;

stopping injection of the cleaning liquid; and separating the cleaning member from the substrate to stop rotation of the substrate.

* * * * *